United States Patent [19]

Batz

[11] 3,766,544

[45] Oct. 16, 1973

[54] ANALOG-TO-DIGITAL CONVERTER EMPLOYING ELECTROSTATIC SIGNAL COUPLING APPARATUS

[75] Inventor: James E. Batz, Northbrook, Ill.

[73] Assignee: Northern Illinois Gas Company, Aurora, Ill.

[22] Filed: Nov. 19, 1971

[21] Appl. No.: 200,369

[52] U.S. Cl......................... 340/347 P, 340/347 DD

[51] Int. Cl................................................. G08c 9/02

[58] Field of Search.................. 340/347 P, 347 DD; 317/16, 253; 334/81, 82

[56] References Cited

UNITED STATES PATENTS

| | | | |
|---|---|---|---|
| 3,198,937 | 8/1965 | Wooster | 340/347 P |
| 3,614,774 | 10/1971 | Clements | 340/347 P |
| 3,603,978 | 9/1971 | Narukiyo | 340/347 P |
| 3,222,668 | 12/1965 | Lippel | 340/347 P |
| 3,268,887 | 8/1966 | Sullivan | 340/347 P |

*Primary Examiner*—Maynard R. Wilbur
*Assistant Examiner*—Jeremiah Glassman
*Attorney*—John A. Dienner et al.

[57] ABSTRACT

An analog-to-digital converter includes an electrostatic encoder having a signal sensor vane mounted for rotation by a shaft to overlie different excitation segments of an excitation member at each of a plurality of predetermined positions of the shaft to be indicated, and signal generating means for selectively extending signals of different phases to groups of excitation segments, the signals being coupled to an output circuit over the sensor vane as a function of the position of the shaft thereby providing a different multi-bit output code over the output circuit for each predetermined position of the shaft.

19 Claims, 5 Drawing Figures

ANALOG-TO-DIGITAL CONVERTER EMPLOYING ELECTROSTATIC SIGNAL COUPLING APPARATUS

BACKGROUND OF THE INVENTION

1. Field of the Invention

This invention relates to analog-to-digital converters, and more particularly, to a converter employing an electrostatic encoder for providing binary coded signals representing angular positions of a shaft.

2. Description of the Prior Art

In my copending U.S. application, Ser. No. 92,445, filed Nov. 24, 1970, now U.S. Pat. 3,717,869 there is described an analog-to-digital converter including a non-contacting type encoder which electrostatically couples signals from a signal generator to a plurality of signal detecting circuits as a function of shaft position to permit the generation of binary coded logic words representing the angular position of the shaft.

The encoder comprises an energizing member mounted for rotation by the shaft, a coupling member for coupling signals of different phases from the signal generator to the shaft mounted energizing member, and a code member including a plurality of sense elements for receiving signals coupled to the code member from the energizing member. The energizing member has a pair of stimulus elements which effect selective coupling of the signals to the sense elements of the code member such that as the energizing member rotates with the shaft, signals of one phase are coupled to certain sense elements and signals of the other phase are coupled to other sense elements.

The sense elements are individually connected to inputs of an associated signal detecting circuit which determines the phase of the signal coupled to a corresponding element by comparing the signals coupled to such element with a reference signal. Each signal detecting circuit provides a logic 1 or a logic 0 level output which corresponds to the detection of signals of one phase or the other, respectively, coupled to an associated sense element. The series of logic 1 and logic 0 outputs provided by the signal detecting circuits form logic words which represent the angular position of the shaft.

While the encoder described in my previous application provides satisfactory operation, the electrostatic encoder provided by my present invention requires fewer signal sensing elements with an attendant reduction in the number of output detecting circuits required to determine the angular position of a shaft. Moreover, the signal coupling elements of the present encoder are simpler in construction and easier to align than those of my previous encoder, thereby simplifying assembly of the encoder. The use of the improved signal coupling apparatus results in an electrostatic encoder which is of smaller size, and is thus more readily adaptable for applications wherein space limitations are a factor, such as in existing utility meter apparatus which employ shaft encoders to permit remote meter readout.

SUMMARY OF THE INVENTION

The present invention provides an analog-to-digital converter having an improved electrostatic encoder for selectively coupling signals of different phases from a signal source to an output circuit as a function of the angular position of a shaft to thereby provide a plurality of multi-bit output codes each of which represents a different predetermined position of the shaft.

In accordance with one embodiment of the invention, the encoder includes an excitation element having a plurality of excitation segments disposed on a surface thereof. Each excitation segment corresponds to one of the shaft positions to be indicated. The encoder further includes a signal coupling member including a sensor vane extending parallel to the surface of the excitation member and a vane cylinder mounted for rotation by the shaft to rotate the sensor vane to overlie a different excitation segment at each predetermined shaft position.

The sensor vane cylinder rotates within, but spaced apart from an output sensing cylinder which is connected to an output detecting circuit.

A set of excitation signals including signals of different phases is extended to a group of segments. Whenever excitation signals are supplied to a segment that is under the sensor vane, such signals are coupled to the output circuit over the signal coupling member and the output sensing cylinder. The output circuit which is connected to the output sensing cylinder normally provides a ground level output. However, the output circuit provides an output of a first polarity whenever signals of a first phase are coupled to the output circuit over the sensor vane and an output of a second polarity whenever signals of a second phase are coupled to the output circuit over the sensor vane.

The set of excitation signals is sequentially advanced so as to be supplied to different groups of the segments whereby a multi-bit output code is provided by the output circuit, with a different multi-bit code being provided for each predetermined position of the shaft.

The encoder of the present invention employs only one position sensor, embodied as the sensor vane and associated sensor vane cylinder, which rotates with the shaft such that the sensor vane overlies a different excitation segment at each shaft position to be indicated. Consequently, only one output circuit is required to enable the detection of signals coupled to the position sensor vane as the excitation segments are selectively energized thereby minimizing the number of signal conductors connected between the signal coupling apparatus and the output circuits. In addition, since the signal wiring to the excitation segments forms the bulk of the encoder wiring, it is easier to shield the high level signal conductors from the signal coupling members and the output circuit such that the effects of stray signal coupling are minimized. Furthermore, reducing the number of signal sensors to one per shaft affords greater freedom in sensor wiring layout.

Moreover, through the use of a single position sensor wider tolerances can be realized for the dimensions of the sensor vane, and the alignment of the signal coupling member relative to the excitation segments and the output sensing cylinder is simplified.

DESCRIPTION OF A PREFERRED EMBODIMENT

Figure 1:
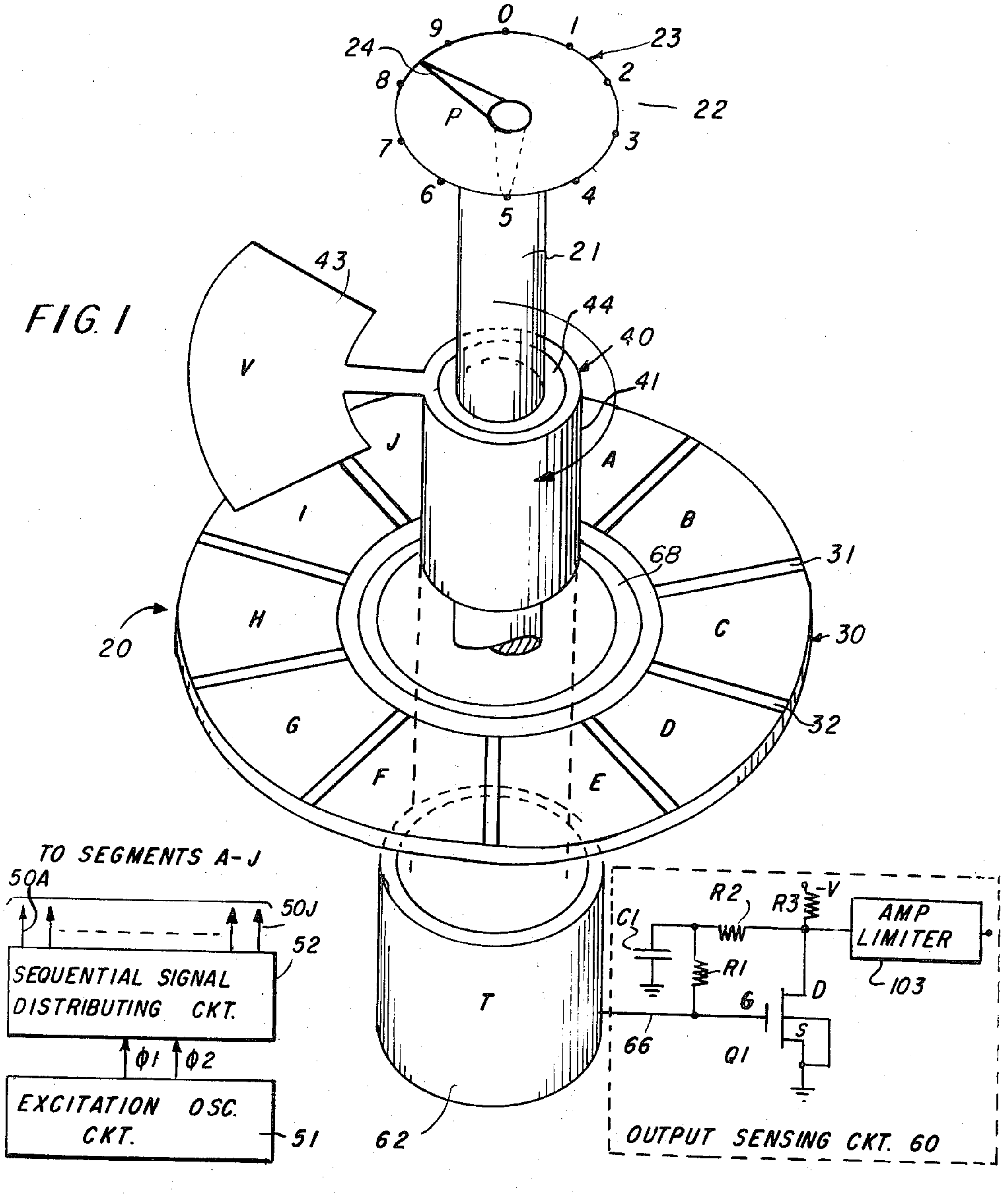
FIG. 1 is a schematic representation of an analog-to-digital converter having an electrostatic encoder provided by the present invention.

A schematic representation of the analog-to-digital converter provided by the present invention is shown in FIG. 1. The analog-to-digital converter includes an encoder 20 for converting analog positions of a shaft 21 into binary coded signals over an output circuit 60. By way of example, the shaft 21 may be associated with a dial register of a utility meter having a plurality of dials, such as dial 23, for indicating measured amounts of a commodity used. In one such application, the dial 23 has 10 digits 0–9 circumferentially spaced about the periphery of the dial. A pointer 24 carried by the shaft 21 provides a visual indication of the angular position of the shaft 21 to thereby indicate a measured quantity.

The encoder 20 includes an excitation member 30 having a plurality of excitation segments A–J, a signal sensing member 62 connected to the output circuit 60, and a signal coupling member 40 mounted for rotation by the shaft 21 relative to the excitation member 30. The signal coupling member 40 selectively couples signals of different phases which are extended to the excitation segments A–J to the signal sensing member 62 as a function of the angular position of the shaft 21.

The energizing member 30 is comprised of a disc 31 of insulating material having 10 wedge-shaped excitation segments A–J circumferentially spaced about the periphery of the disc 31 on a common surface 32 thereof. Each excitation segment, which is of an electrically conducting material, is slightly less than 36° in angular width such that adjacent segments, such as segments A and B, are spaced apart from one another. The segments A–J have approximately the same surface area.

The excitation segments A–J are connected to outputs **50*a*–50*j*, respectively, of an excitation circuit 50 which includes signal generating means 51 for providing signals of a first and a second phase at outputs $\phi$1 and $\phi$2, respectively. The excitation circuit 50 further includes a signal distributing circuit 52 which sequentially extends signals of phase $\phi$1 to one of the excitation segments and signals of phase $\phi$2** to two other segments. The set of excitation signals is then sequentially advanced in unison to other groups of excitation segments in a manner which will be described hereinafter.

Figure 2:
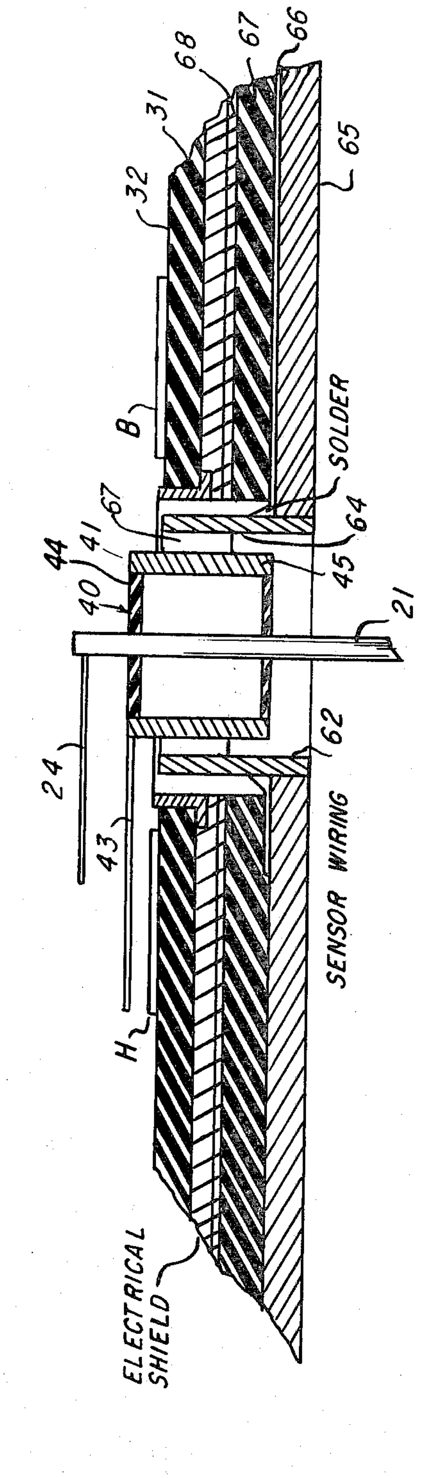
FIG. 2 is a sectional view of the electrostatic encoder shown in FIG. 1.

Referring to FIG. 2, the coupling cylinder 41, which is of an electrically conductive material, is mounted on the shaft 21 and electrically insulated from the shaft by insulating material 44. The assembly of the cylinder 41 and the shaft 21 rotates within the hollow cylinder 62 which forms the sensing member 62. The sensing cylinder 62, which is of an electrically conductive material, is secured to a sheet of insulating material 65. The insulating sheet 65 includes an output conductor 66 which is electrically connected to the cylinder 62 by a suitable means such as solder. The output conductor 66 is further connected to the output circuit 60 (FIG. 1) for extending signals coupled to the sensing cylinder 62 over the signal coupling member 40 to the output circuit 60.

The insulating sheet 65 which carries the output signal conductor 66 is separated from the insulating sheet 31 which carries the excitation segments A–J by a further insulating sheet 67 which includes a layer of shielding material 68. The shielding material serves to shield the output sensing cylinder 62 and the output conductor 65 from high level signals extended to the excitation segments A–J disposed of sheet 31. Accordingly, only signals coupled to the signal coupling cylinder 41 or the sensing vane 43 are in turn coupled to the output signal sensing cylinder 62.

The assembly of shaft 21 and the cylinder 41 of the signal coupling member 40 is positioned within the output signal sensing cylinder 62 by suitable mounting means (not shown) associated with the shaft 21 such that a portion of the outer wall 45 of cylinder 41 overlaps a portion of the inner wall 64 of sensing cylinder 62. The walls of cylinders 41 and 62 are spaced apart from one another forming a gap 67 therebetween to permit signal coupling between the cylinders 41 and 62. In addition, the shaft 21 positions the signal coupling member 40 relative to the assembly of insulating sheets 31, 67 and 65 so as to maintain a predetermined spacing between the surface of the sensing vane 43 and the surface 32 of the excitation disc 31 to permit signal coupling between the excitation segments A–J and the sensing vane 43.

The angular position of the sensor vane 43 and correspondingly, the position of the shaft 21 which rotates the sensor vane 43 is determined by selectively applying signals of different phases to groups of the excitation segments A–J and monitoring output signals coupled to the output sensing member 62. The signals extended to the excitation segments are coupled over the coupling member 40 to the sensing element 62 whenever the sensor vane 43 is above an energized segment.

The manner in which excitation signals are extended to the excitation segments A–J will now be set forth.

Figure 3:
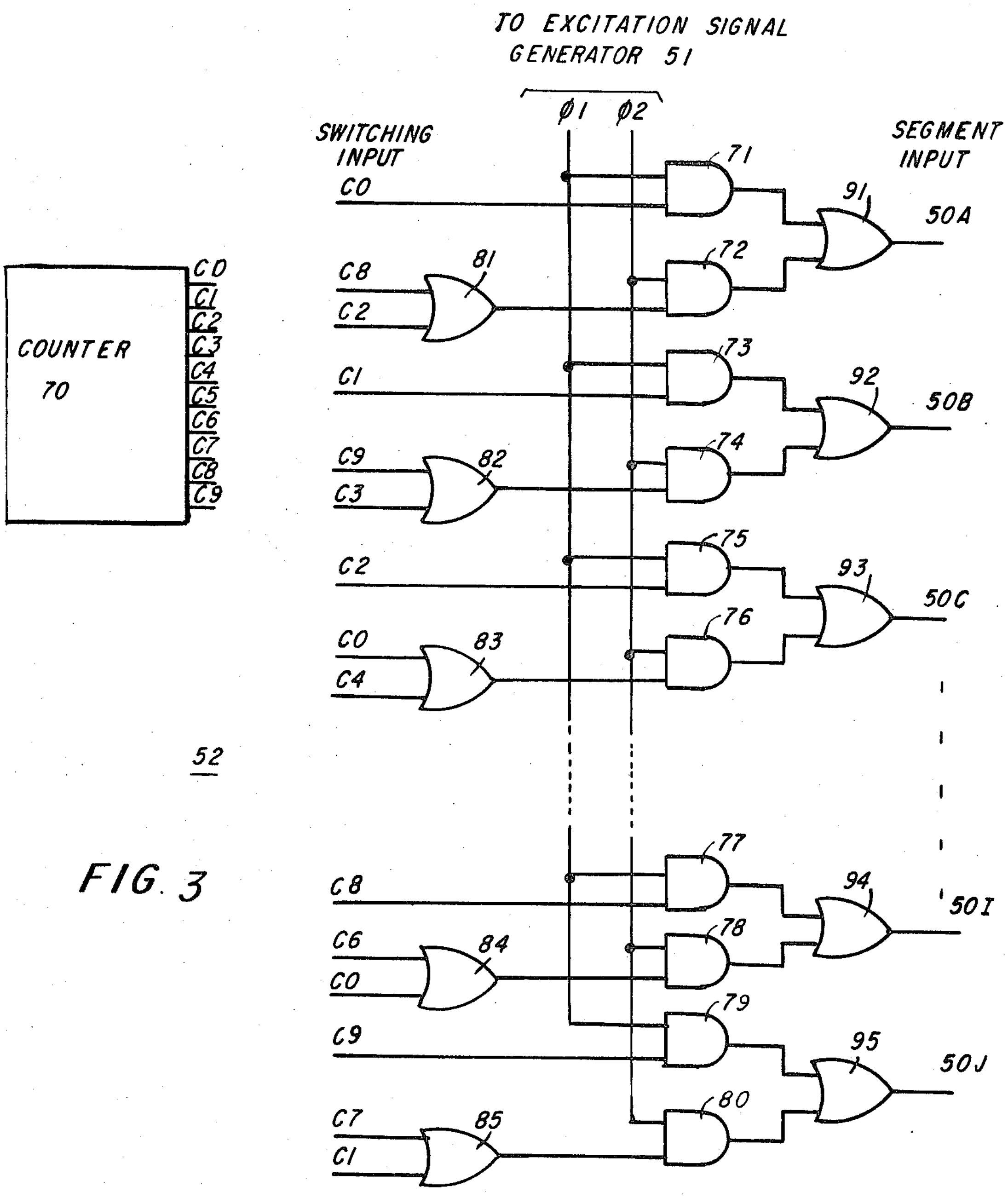
FIG. 3 is a schematic representation of logic circuits for sequentially switching excitation signals to the excitation segments of the electrostatic encoder.

Referring to FIG. 3, there is shown a schematic representation of the signal distributing or selection circuits 52 which selectively extend signals from the signal generator 51 to the excitation segments A–J of the excitation member 30. The signal distributing circuit 52 includes a plurality of two input AND gates, such as gates 71–80, and a plurality of OR gates, such as gates 91–95, each of which combines the outputs of an associated pair of AND gates. Each pair of AND gates, such as AND gates 71 and 72, and an associated OR gate, such as gate 91, serve as a select circuit which is operative whenever one of the AND gates 71,72 of a pair is enabled to gate signals of either phase $\phi$1 or phase $\phi$2 to one of the excitation segments, segment A for gates 71,72 and 91. Segment A is connected to the output of OR gate 91 over conductor 50A.

It is pointed out that although only five pair of AND gates, such as AND gates 71 and 72 and an associated OR gate 91 are shown in FIG. 3, 10 such sets of gates are provided for selectively extending signals of either phase $\phi$1 or $\phi$2 to the 10 excitation segments A–J over conductors 50A–50J, respectively, Thus, for example, whenever gate 71 is enabled, signals of phase $\phi$1 are extended to segment A over OR gate 91 and conductor 50A, and whenever gate 72 is enabled, signals of phase $\phi$2 are extended to segment A over OR gate 91 and conductor 50A.

The AND gates 71–80 are selectively enabled by enabling output signals provided by a counter 70 which provides a count of 10 over outputs C0-C9.

Accordingly, AND gate 71 has a first input connected to the output $\phi1$ of the signal generating circuit 51 and a second input connected to the output C0 of the counter 70. The associated AND gate 72 has a first input connected to output $\phi2$ of the signal generating circuit 51. The outputs C8 and C2 of the counter 70 are connected to a second input of gate 72 over an OR gate 81. Similarly, AND gates 73, 75, 77 and 79 each have a first input connected to the output $\phi1$ of the signal generating circuit 51 and a second input connected directly to outputs C1, C2, C8, and C9, respectively, of the counter 70. Gates 74, 76, 78 and 80 each have a first input connected to the output $\phi2$ of the signal generating circuit 51 and a second input connected to the output of OR gates 82, 83, 84, and 85, respectively. Each of the OR gates 82–85 has two inputs connected to a different pair of outputs of the counter 70 as shown in FIG. 3.

Figure 4:
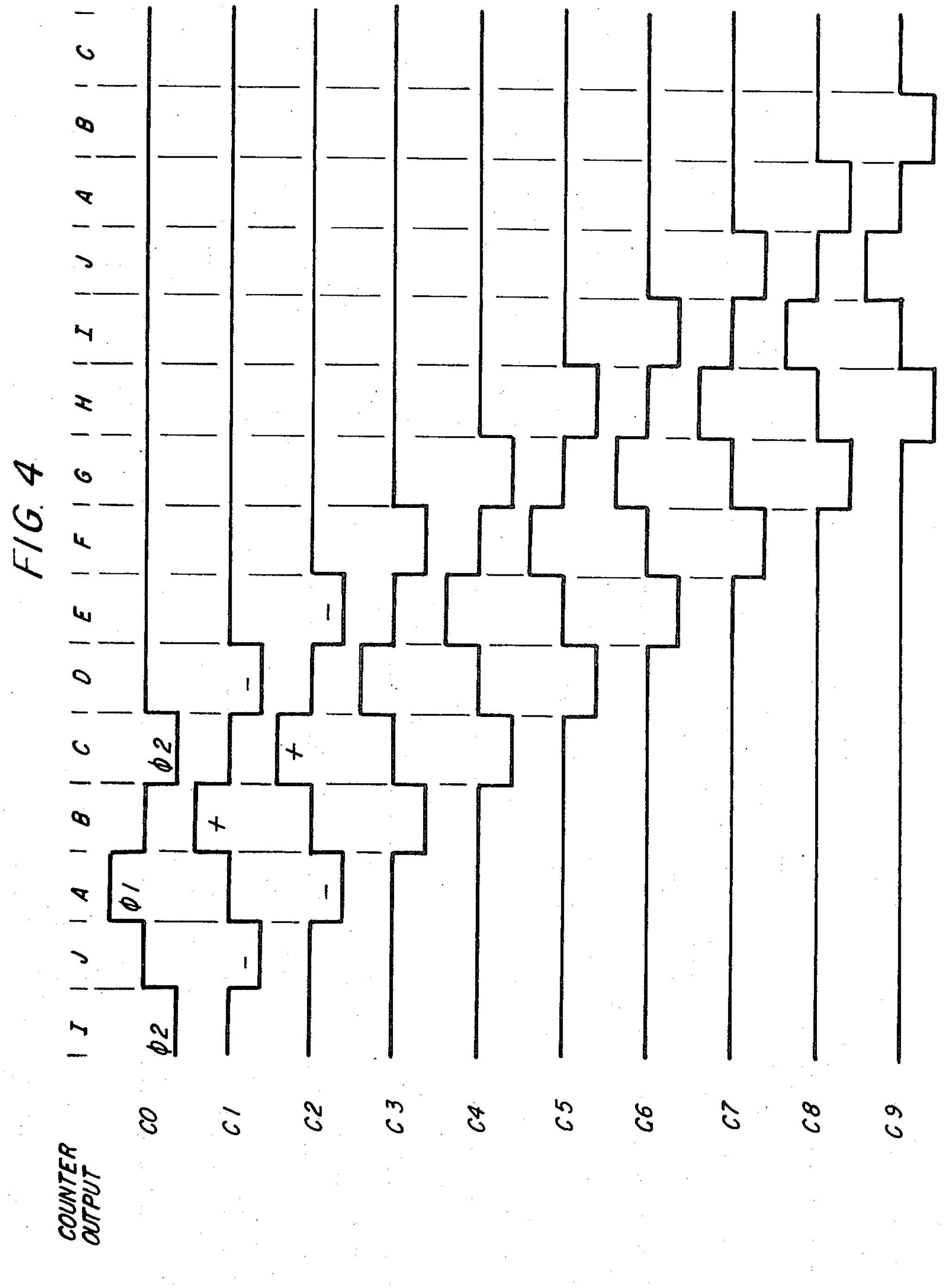
FIG. 4 is a diagram showing the sequence in which excitation signals are applied to the excitation segments of the encoder.

As the counter 70 cycles to provide enabling signals consecutively at outputs C0–C9, signals of phase $\phi1$ are extended to a different one of the excitation segments A–J at each count and signals of phase $\phi2$ are extended to two other segments at each count as shown in FIG. 4 which is a diagram indicating the phases of the excitation signals extended to each segment for each count of the counter 70. Thus, for example, to initiate read out of the angular position of the shaft 21, when the counter 70 is at the count of 0, gate 71 will be enabled by the output at C0 to pass signals of phase $\phi1$ from the signal generating circuit 51 over OR gate 91 and conductor 50A to segment A. Simultaneously, gates 76 and 78 will also be enabled by the enabling signals provided over OR gates 83 and 84 to pass signals of phase $\phi2$ over OR gates 93 and 94 and conductors 50C and 50I to segments C and I as shown in the first line of the diagram shown in FIG. 4.

As the counter 70 steps to a count of 1, AND gate 73 will be enabled to extend signals of pbase $\phi1$ over OR gate 92 and output 50B to segment B. ALso during the count of one, signals of phase $\phi2$ will be extended over appropriate logic gates to segments J and D as shown in the second line of FIG. 4. When the counter 70 steps to the count of 2, signals of phase $\phi1$ will be extended to segment C and signals of phase $\phi2$ will be extended to segments A and E, as shown on line 3 of FIG. 4. Thus, as the counter 70 continues to step, signals are selectively extended to the excitation segments A–J in the manner described above providing the pattern of excitation signals shown on lines 4–9 of FIG. 4.

For purposes of illustrating the manner in which signals are coupled from the excitation elements A–J to the output circuit 60,it is assumed that signals of phase $\phi1$ are being supplied to the segment A and that signals of phase $\phi2$ are being supplied to segments I and C.

Figure 5:
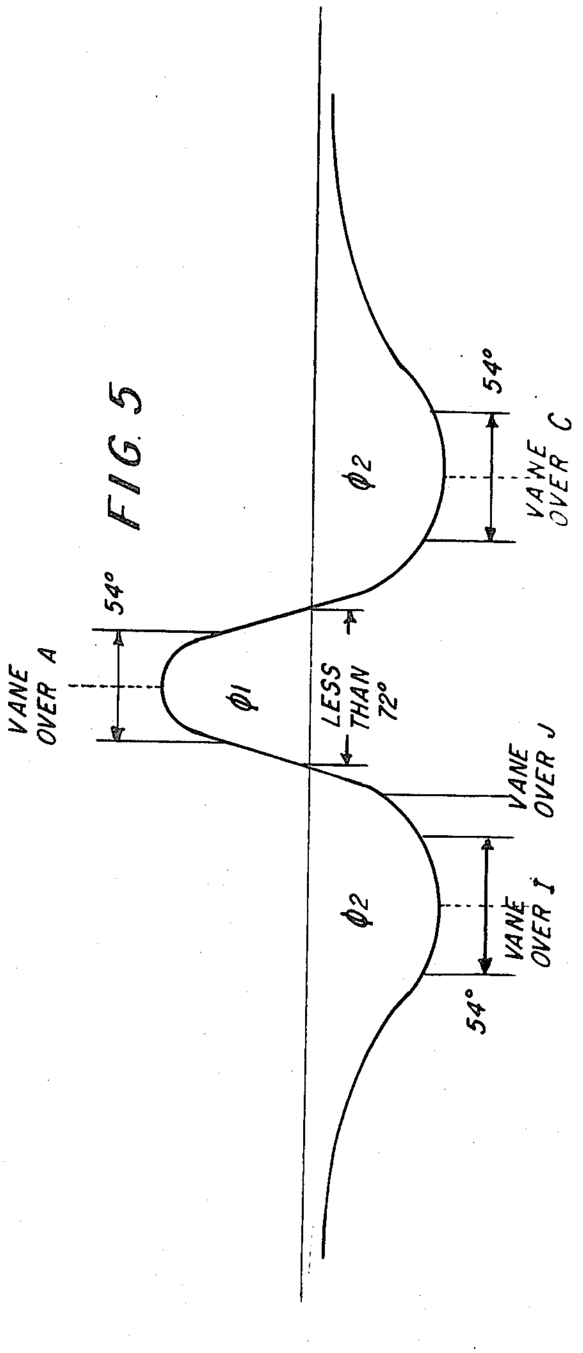
FIG. 5 shows the waveform of signals coupled to the output sensing circuit of the encoder as the sensor vane is positioned over different energizing segments.

Referring to FIG. 5, if the sensing vane 43 is centered over segment A, a large amplitude signal of phase $\phi1$ (representing a logic 1 level) will be coupled to the output sensing cylinder 62 as shown in FIG. 5. A positive amplitude signal is coupled to the output sensing cylinder 62 as the vane 43 rotates approximately 72° moving from a position overlying segment J to a position overlying segment B. As can be seen in FIG. 5, a logic 1 indication is provided for approximately 54° of rotation of the vane 43.

Alternatively, if the vane 43 is centered over segments I or C, a large amplitude signal of phase $\phi2$ (representing a logic 0 level) will be coupled to the output sensing cylinder 62, as shown in FIG. 5, and a logic 0 indication will be provided for approximately 54° of rotation of the vane relative to either segment I or segment C.

When the vane is centered over segment J, as indicated in FIG. 5, a small signal of phase $\phi2$ will be coupled to the cylinder 62. This is due to the unbalance caused by extending signals of phase $\phi2$ to two segments I and C and extending signals of phase $\phi1$ to only one segment A. Although signals of phase $\phi1$ coupled to the vane 43 from segment A will cancel signals of phase $\phi2$ coupled to the vane from segments I, signals of phase $\phi2$ are coupled directly to the vane cylinder 41 by static coupling from segment C, providing the low amplitude phase $\phi2$ signal that is coupled to cylinder 62. Consequently, the null condition of the waveform as indicated in FIG. 5 will occur when the vane 43 has rotated clockwise toward segment A from the position when the vane is centered over segment J.

It is further pointed out that when the vane overlies unenergized segments D–H, in the present example, a low level signal of phase $\phi2$ will be coupled to the vane cylinder 41. Accordingly, the output circuit 60 may include a level detecting circuit having a threshold circuit that is responsive only to signals of an amplitude greater than the amplitude of a low leve signal caused by static coupling effects.

OUTPUT DETECTING CIRCUITS

The signals coupled to the vane 43 or the vane cylinder 41 from the sensing segments that are energized are in turn coupled to the sensing cylinder 62 which is connected over conductor 66 to the output circuit 60. The output circuit 60 includes a field-effect transistor Q1 connected as an non-inverting amplifier. The field-effect transistor or FET Q1 has a gate connected over lead 66 to the sensing cylinder 62. The gate of FET Q1 is further connected through the series connected resistors R1, R2, and R3 to a voltage source −V. A capacitor C1 is connected between the junction of resistors R1 and R2 and ground. The source of FET Q1 is connected to the ground. The drain of FET Q1 is connected over resistor R3 to the voltage source −V.

The output of the FET amplifier at the drain of field-effect transistor Q1 may be connected to an amplifier-limiter circuit 103 to provide further amplification of the excitation signals and to limit the amplitude of the amplified signals thereby providing square wave output signals. The output circuit 60 provides a positive square wave output signal representing a logic 1 level whenever signals of phase $\phi1$ are coupled to the output circuit 60 and a ground level output signal representing a logic 0 level whenever signals of phase $\phi2$ are coupled to the output circuit 60.

OPERATION OF THE ENCODER

For purposes of illustration of the operation of the encoder, it is assumed that the sensor vane 43 is in the position shown in FIG. 1 to overlie excitation segment I. Referring to FIG. 3, when readout is initiated the counter 70 is at a count of zero. Accordingly, an enabling signal is provided at output C0 to effect enabling of AND gates 71, 76 and 78. Consequently, signals of phase $\phi1$ are supplied to segment A and signals of phase $\phi2$ are supplied to segments I and C as shown in FIG. 4. Since the sensor vane 43 is overlying segment I, signals of phase $\phi 2$ will be coupled to the output circuit 60 which will provide a logic 0 output.

As the counter 70 steps through counts one to five, the set of excitation signals will be extended sequentially to groups of segments JBD, ACE, BCF, CEG, and DFH as indicated in FIG. 4. Since the sensor vane 43 is not adjacent the segments of these groups static couplings of phase $\phi 2$ will provide a ground level (logic 0) output over the output circuit 60.

When the counter 70 reaches a count of six, signals of phase $\phi 1$ will be extended to segment G and signals of phase $\phi 2$ will be extended to segments E and I. Since the sensor vane 43 overlies segment I in the present example, signals of phase $\phi 2$ will again be coupled to the output circuit 60 and a logic 0 level output will be provided.

At the count of seven, signals of phase $\phi 1$ will be extended to segment H and signals of phase $\phi 2$ will be extended to segments F and J. Accordingly, signals of phase $\phi 2$ coupled to vane 43 from segment H will be cancelled by signals of phase $\phi 2$ which are coupled to the sensor vane 43 from segment J and a ground level output will be provided by the output circuit 60.

As the counter 70 steps to a count of eight, signals of phase $\phi 1$ will be extended to segment I and signals of phase $\phi 2$ will be extended to segments G and A. At such time, signals of phase $\phi 1$ will be coupled to the sensor vane 43 from segment I and extended to the output circuits 60 which provides a logic 1 output.

At the count of nine, the signal distributing circuit will extend signals of phase $\phi 1$ to segment J and signals of phase $\phi 2$ to segments H and B. Since signals of phases $\phi 1$ and $\phi 2$ are being coupled to the sensor vane 43 from segments H and J, respectively, the net signal output extended to the output circuits 60 will be a small amplitude signal of phase $\phi 2$ and the output circuits will provide a ground level output.

When the counter once again reaches a count of zero, a logic 0 output will be provided by the output circuit 60 as the result of signals phase $\phi 2$ being extended to segment I which is adjacent the sensor vane 43.

Thus, when the counter 70 provided the counts of 6, 8 and 0, the output circuit 60 provided respective outputs logic 0, logic 1 and logic 0. This sequence of logic outputs provided by the output circuits 60 is indicative of the position of the vane, and correspondingly, the angular position of the shaft 21.

It is pointed out that the multi-bit sequence of logic 0 and logic 1 levels are provided to assure that the logic 1 level provided by the output circuit is responsive to energization of corresponding segments and not the result of stray signal coupling. Thus, the positional indication is always indicated by one or two bits of logic 1 output provided by the output circuit 60. A different multi-bit sequence will be provided for each of the ten digit positions of the shaft 21.

The state of the counter 70 indicates which segment is being supplied with signals of phase $\phi 1$; therefore, the position of the vane 43 and correspondingly the shaft 21 can be determined by comparing the time of occurrence of the sequence of output signals provided by the output circuit 60 to the state of the counter 70. Thus, in the present example, the logic 1 level output of the multi-bit sequence is provided when the counter 70 has reached a count of eight, indicating the sensor vane 43 is overlying segment I which corresponds to digit position 8.

Digressing, whenthe encoder 20 of the present invention is used in an application for converting angular positions of a shaft of a dial register of a utility meter, a digit position corresponds to a position intermediate a pair of adjacent digits on the meter dial. Thus, with reference to FIG. 1, the pointer 24, which is carried by shaft 21, is shown to be intermediate the numbers eight and nine on the dial 23. Such position corresponds to the digit position eight. Each of the excitation segments A–J represents one digit position and is positioned relative to the dial 23 such that the axial centerline of a given segment lies intermediate a pair of digit numbers on the dial 23. Thus, for example, the axial centerline of segment 1 lies between the numbers eight and nine on dial 23.

Since the multi-bit output code provided indicates the sensor vane 43 is overlying the segment I, the pointer 24 is thus indicating a reading of eight.

As a further example, it is assumed that the sensor vane 43 is positioned midway between a pair of adjacent segments, such as segments E and F in which case the pointer 24 will point to the digit five as indicated by the dotted lines in FIG. 1. The excitation signals of phases $\phi 1$ and $\phi 2$ will again be selectively extended to the groups of excitation segments in the manner shown in the diagram of FIG. 4. During the counts zero and one, only low amplitude signals of phase $\phi 2$ will be coupled to the output circuit 60 and accordingly, the output circuits will provide a logic 0 output. When the counter 70 reaches the count of two, the signals of phase $\phi 2$ supplied to segment E, as indicated in FIG. 4, will be coupled to the output circuit 60 providing a logic 0 output. Similarly, during the count of three, the signals of phase $\phi 2$ extended to segment F will again be coupled over the sensor vane 43 to the output circuit 60 and a further logic 0 output will be provided.

When the counter reaches a count of four, signals of phase $\phi 1$ will be extended to segment E while signals of phase $\phi 2$ will be extended to segments C and G. Accordingly, the phase $\phi 1$ signals will be coupled over the sensor vane 43 to the output circuits 60 which will provide a logic 1 output. Thereafter, during the count of five, the signals of phase $\phi 1$ extended to segment F will again be coupled over the sensing element 43 to the output circuit 60 providing a further logic 1 output. During the counts of six or seven signals of phase $\phi 2$ extended to segments E and F, respectively, the output circuits will cause logic 0 level outputs to be generated by the output circuit 60.

Thus, during the counts of four and five, the output circuit 60 provides two consecutive logic 1 level outputs while during the counts of three and six, logic 0 level outputs are provided. This sequence of logic level outputs indicates that the sensor vane 43 is positioned intermediate two adjacent segments, E and F in the present example, which represent digit positions 4 and 5, respectively. Consequently, the reading will have to be rounded down to 4 or rounded up to 5. One technique for processing shaft position information to provide roundoff of meter reading data is described in the copending U.S. application Ser. No. 199,589 of D. Martell, filed Mar. 1, 1971 and assigned to the same assignee as the present invention.

Thus, the electrostatic encoder 20 provided by the present invention provides a plurality of multi-bit output words each of which represents a different digit position of a shaft 21. The encoder 20 further provides multi-bit output words which represent positions intermediate the digit positions to be indicated thereby providing an unambiguous coding for the digit positions of the shaft.

I claim:

1. In an analog-to-digital converter including an encoder for providing a different set of outputs for each of a plurality of predetermined angular positions of a shaft, excitation means including a plurality of excitation segments each representing a different one of said predetermined shaft positions, a signal coupling member mounted for rotation by said shaft to overlie different ones of said segments at each shaft position to permit signal coupling therebetween, output means coupled to said signal coupling member, and energizing means for extending at least one excitation signal to said segments in a multistep sequence such that said excitation signal is applied to a different one of said segments in successive steps of said sequence, whereby said excitation signal is coupled over said signal coupling member from one of said segments to said output means at a particular step of the sequence to thereby indicate the angular position of said shaft.

2. In an analog-to-digital converter including an encoder for providing a different set of outputs for each of a plurality of predetermined angular positions of a shaft, excitation means including a plurality of excitation segments of an electrically conductive material, signal distributing means for applying excitation signals to said segments in a multistep sequence such that said excitation signals are applied to a different plurality of said segments in successive steps of said sequence, output means and signal coupling means including a signal coupling member of an electrically conductive material, mounted for rotation by said shaft to overlie a segment of a different one of said segments at each shaft position, whereby said excitation signals are coupled over said signal coupling member from the segment adjacent said signal coupling member to said output means in a sequence representing the angular position of said shaft, and means in said output means responsive to excitation signals coupled thereto to provide a set of signal outputs representing the angular position of said shaft.

3. An analog-to-digital converter as set forth in claim 2 wherein said signal distributing means includes signal generating means for providing excitation signals of first and second phases.

4. An analog-to-digital converter as set forth in claim 3 wherein said signal distributing means includes gating means including a plurality of gate circuits each connected between said signal generating means and a different one of said excitation segments, and control means for selectively enabling said gate circuits in groups to sequentially extend excitation signals to a different plurality of excitation segments.

5. An analog-to-digital converter as set forth in claim 4 wherein said excitation means includes an excitation member, said excitation segments being disposed on a surface of said excitation member in a single annular track.

6. An analog-to-digital converter as set forth in claim 5 wherein at least one of said gating circuits is operable when enabled to extend signals of said first phase to a first segment of one of said plurality of segments and signals of said second phase to two other segments of said one plurality of said segments whereby signals of the first phase are coupled to said signal coupling member whenever said signal coupling member is adjacent said first segment, signals of said second phase are coupled to said signal coupling member whenever said signal coupling member is adjacent said second segment, and signals of both phases are coupled to said signal coupling member whenever said signal coupling member is adjacent a segment intermediate said first and second segments.

7. In an analog-to-digital converter including an encoder for providing a different set of outputs for each of a plurality of angular positions of a shaft, excitation means including an excitation member having a plurality of excitation segments of an electrically conductive material disposed on a surface thereof, signal distributing means for applying excitation signals of different phases to said segments in a multistep sequence such that said excitation signals are applied to a different plurality of said segments in successive steps of said sequence, a signal coupling member of an electrically conductive material mounted for rotation by said shaft to overlie a different one of said segments at each shaft position, whereby excitation signals of different phases are coupled to said signal coupling member from the segment adjacent said signal coupling member in a sequence representing the angular position of the shaft.

8. An analog-to-digital converter as set forth in claim 7 wherein said encoder includes output means coupled to said signal coupling member, said output means being responsive to signals of a first phase coupled thereto over said signal coupling member to provide a first output signal and responsive to signals of a second phase coupled thereto over said signal coupling member to provide a second output signal whereby a set of output signals representing the angular position of the shaft is provided over said output means as said excitation signals are sequentially applied to said segments.

9. An analog-to-digital converter as set forth in claim 7 wherein said output means comprises a signal sensing member including a first hollow cylinder of a first diameter and wherein said signal coupling member includes a second cylinder of a diameter less than the first diameter, mounted for rotation within said first cylinder in spaced relation therewith with at least a portion of the outer wall of said second cylinder overlapping at least a portion of the inner wall of said first cylinder to permit signal coupling therebetween.

10. An analog-to-digital converter as set forth in claim 9 including electrostatic shielding means interposed between said excitation member and said signal sensing cylinder to minimize electrostatic coupling between said excitation segments and said signal sensing cylinder.

11. An analog-to-digital converter as set forth in claim 9 wherein each of said excitation segments comprise a planar element and said signal coupling member comprises a flat vane member electrically connected to said second cylinder and extending therefrom in a parallel spaced relationship with the excitation segments on the surface of said excitation member.

12. In an analog-to-digital converter including an encoder for providing a different set of outputs for each of a plurality of angular positions of a shaft, excitation means including an excitation member having a plurality of excitation segments of an electrically conductive material, signal distributing means for applying excitation signals to a plurality of groups of said segments in a predetermined sequence, said signal distributing means including means for providing excitation signals of a first phase at a first output thereof and for providing excitation signals of a second phase at a second output thereof and gating means for extending signals of said first phase to one of the segments of each group in said predetermined sequence and for extending excitation signals of said second phase to a pair of other segments of each group in said predetermined sequence, a signal sensing member of an electrically conductive material, and signal coupling means including a signal coupling member of an electrically conductive material mounted for rotation by said shaft to overlie a segment of a different one of said groups of segments at each shaft position to be indicated, said signal coupling member being operable to couple excitation signals of said first and second phases from the segment adjacent said signal coupling member to said signal sensing member in a sequence representing the angular position of the shaft.

13. An analog-to-digital converter as set forth in claim 12 wherein said signal distributing means further includes control means for controlling said gating means to select the segments to which excitation signals are extended at each step of said sequence.

14. An analog-to-digital converter as set forth in claim 13 wherein said gating means includes a plurality of gate circuits each having a first input connected to the first output of said signal generating means, a second input connected to the second output of said signal generating means, an output connected to a different one of said segments and a plurality of enabling inputs connected to outputs of said control means.

15. In an analog-to-digital converter, an encoder for providing 20 output words representing the coding for 10 digit positions of a shaft and 10 positions intermediate said digit positions, said encoder comprising an excitation member having 10 excitation segments disposed on a surface thereof in a single annular track, each segment representing a different one of said digit positions, signal distributing means for extending excitation signals to a different group of three of said segments in successive steps of at least a ten step sequence, output means including an output circuit and signal coupling means including a signal coupling member mounted for rotation by said shaft to overlie a different one of said segments at each digit position of said shaft, whereby the excitation signals are coupled to the output circuit at steps of the sequence in which excitation signals are extended to the segment adjacent the signal coupling member.

16. An analog-to-digital converter as set forth in claim 15 wherein said signal distributing means includes means for providing signals of a first and a second phase and means for extending signals of said first phase to one of the segments of each group in sequence and for extending signals of said second phase to two other segments of each group in sequence.

17. An analog-to-digital converter as set forth in claim 16 wherein a first sequence of signals of first and second phases is coupled to said output circuit to indicate each digit position and wherein a second sequence of signals of first and second phases is coupled to said output circuit to indicate positions intermediate a pair of adjacent digit positions.

18. In an analog-to-digital converter including an encoder for providing a different set of output signals for each of a plurality of predetermined angular positions of a shaft, selector switch means having access to a group of circuits including selection means for simultaneously selecting a plurality of said circuits and extending energization signals to the selected plurality of circuits, and sequence means for stepping said selection means to successively select a dif-ferent plurality of said circuits, sensor means mounted for rotation by said shaft to a plurality of different positions, and means for providing a set of output signals which is dependent upon the plurality of circuits which are energized at the point of location of the sensor means.

19. In an analog-to-digital converter including an encoder for providing a different set of outputs for each of a plurality of predetermined angular positions of a shaft, excitation means including a plurality of excitation segments, signal distributing means including select means for simultaneously selecting a plurality of said excitation segments and extending excitation signals to the selected plurality of said excitation segments and sequencing means for controlling said select means to successively select a different plurality of said excitation segments, and sensor means mounted for rotation by said shaft to overlie a different one of said excitation segments at different predetermined positions of said shaft whereby, when the excitation segment adjacent said sensor means is selected by said select means, excitation signals are coupled to said sensor means in a sequence representing the angular position of said shaft.

* * * * *